(12) United States Patent
Dip (10) Patent No.: US 11,781,220 B2
(45) Date of Patent: Oct. 10, 2023

(54) MULTIPLE ZONE GAS INJECTION FOR CONTROL OF GAS PHASE RADICALS

(71) Applicant: Tokyo Electron Limited, Tokyo (JP)

(72) Inventor: Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 3 days.

(21) Appl. No.: 17/547,521

(22) Filed: Dec. 10, 2021

(65) Prior Publication Data

US 2022/0098733 A1 Mar. 31, 2022

Related U.S. Application Data (62) Division of application No. 16/421,358, filed on May 23, 2019, now Pat. No. 11,274,370.

(60) Provisional application No. 62/676,173, filed on May 24, 2018.

(51) Int. Cl.
*C23C 16/455* (2006.01)
*C23C 16/52* (2006.01)
*H01L 21/02* (2006.01)

(52) U.S. Cl.
CPC .. *C23C 16/45544* (2013.01); *C23C 16/45565* (2013.01); *C23C 16/52* (2013.01); *H01L 21/0228* (2013.01); *H01L 21/02164* (2013.01)

(58) Field of Classification Search
CPC ........ C23C 16/45544; C23C 16/45565; C23C 16/52; H01L 21/02164; H01L 21/0228
See application file for complete search history.

(56) References Cited

U.S. PATENT DOCUMENTS

| | | | | |
|---|---|---|---|---|
| 2006/0223315 A1* | 10/2006 | Yokota | ............... | H01L 21/67115 118/724 |
| 2007/0072438 A1* | 3/2007 | Joe | ..................... | H01L 21/02236 438/774 |
| 2009/0035463 A1* | 2/2009 | Dip | .................... | H01L 21/67098 427/255.28 |
| 2011/0065276 A1* | 3/2011 | Ganguly | ........... | H01L 21/67207 257/E21.257 |
| 2016/0111258 A1* | 4/2016 | Taskar | .............. | H01L 21/67069 118/723 VE |
| 2016/0293431 A1* | 10/2016 | Sriraman | .......... | C23C 16/45561 |

* cited by examiner

*Primary Examiner* — Benjamin Tzu-Hung Liu (57) ABSTRACT

A process and apparatus is provided in which improved control of gas phase radicals is provided. In one embodiment, a system generating atomic oxygen is provided in which gases which generate the atomic oxygen are mixed prior to injection in a process space. The mixing may occur within a showerhead or prior to entrance into the showerhead. In another embodiment, a showerhead is provided which includes multiple zones. Some of the zones of the showerhead may inject the mixture of gases which generate the atomic oxygen into the process space, while other zones do not inject that mixture. In one embodiment, the mixture of gases which generates the atomic oxygen is injected into a main zone, while a subset of those gases is injected into inner and outer zones of the showerhead. The process and apparatus provides a uniform density of atomic oxygen across the substrate being processed.

6 Claims, 9 Drawing Sheets

MULTIPLE ZONE GAS INJECTION FOR CONTROL OF GAS PHASE RADICALS

CROSS REFERENCE TO RELATED APPLICATIONS

This application is a divisional of U.S. Nonprovisional patent application Ser. No. 16/421,358, entitled "Multiple Zone Gas Injection for Control of Gas Phase Radicals", filed May 23, 2019, which claims priority to U.S. Provisional Patent Application No. 62/676,173, entitled "Multiple Zone Gas Injection for Control of Gas Phase Radicals", filed May 24, 2018; the disclosure of which is expressly incorporated herein, in its entirety, by reference.

BACKGROUND

The present disclosure relates to the processing of substrates. In particular, it provides an apparatus and method for treating surfaces of substrates.

Atomic layer deposition is a known technique for forming layers on a substrate. In atomic layer deposition, substrates are cyclically exposed to alternate gaseous species (or precursors). The gaseous species react with the substrate surface in a self-limiting or near self-limiting manner. A thin film may be slowly formed by repeating the cycles of alternating gaseous species. A variety of process tools may be utilized in atomic layer deposition processes. For example, batch furnace type systems may be utilized. Single substrate systems in which a process chamber is filled with gas and evacuated for a single substrate may also be utilized. Yet another system is a spatial atomic layer deposition system. In spatial atomic layer depositions systems, substrates travel at relatively high speeds past gas injectors or past a gas showerhead, or past a showerhead with injector outlets, which inject the necessary gases proximate the substrate surface to accomplish the atomic layer deposition process steps as the substrate passes in a cyclical manner.

One known atomic layer deposition process is the formation of atomic layer deposition oxide films, for example, silicon oxide. An exemplary process may include sequentially exposing the substrate surface to a silicon containing gas followed by exposure of the substrate surface to atomic oxygen (O). Atomic oxygen may be preferred due to excellent oxidation properties that result in a high quality silicon oxide deposited film. Exemplary spatial atomic layer deposition processes may include first exposing the substrate to silicon containing gas, such as for example, dichlorosilane (DCS), trichlorosilane, etc.). Next, the substrate may be exposed to atomic oxygen. Typical techniques for producing atomic oxygen include injecting a gas combination of oxygen (O2) and hydrogen (H2) above the substrate surface individually, where upon the O2 and H2 mix and react to form gas phase byproducts such as atomic oxygen (O). The atomic oxygen (O) may react with the silicon on the substrate to form silicon oxide. Such techniques are known as low pressure radical oxidation (LPRO). Typically the process occurs with the substrate heated and the injection of O2 and H2 at desired ratios at a low pressure (sub 10 Torr). The chemistries described above are merely exemplary known chemistries for atomic layer deposition of silicon oxide and it will be recognized that other chemistries may exist and atomic layer deposition of other materials may exist.

The creation of atomic oxygen in systems like a spatial systems may have other uses in addition to atomic layer deposition processes. For example, other uses of atomic oxygen surface treatments are known. In one embodiment, atomic oxygen may be provided at a surface so as to diffuse into the surface to form a diffused silicon oxide layer.

A problem that exists in systems utilizing atomic oxygen is providing a uniform density of the atomic oxygen across the surface of the substrate. A non-uniform density of atomic oxygen may result in a non-uniformly deposited film and other problems. For example, the non-uniformity of atomic oxygen will change the amount of atomic oxygen that diffuses into the substrate and change the formation of a diffused silicon oxide film. Such diffused films are generally undesirable in atomic layer deposition process due to consumption of the underlying material as opposed to forming a deposited film. Further, non-uniform atomic oxygen density will result in a non-uniform oxidation of the adsorbed silicon species. For example, if the adsorbed molecule is DCS, the DCS may not be fully oxidized and converted to silicon oxide. Subsequent cycles of DCS exposure may result in less DCS adsorption and thereby non-uniformities in the silicon oxide ultimately deposited.

Thus, it would be desirable to provide a system and method that provides for the improved uniformity of the density of gas phase radicals above a substrate.

SUMMARY

A process and apparatus is provided in which improved control of gas phase radicals is provided. In one embodiment, improved control of atomic oxygen is provided. In one embodiment, a system utilizing atomic oxygen is provided in which gases which generate the atomic oxygen are mixed prior to injection in a process space. The mixing may occur within a showerhead or may occur prior to entrance into the showerhead. In another embodiment, a showerhead is provided which includes multiple zones. Some of the zones of the showerhead may inject the mixture of gases which generate the atomic oxygen into the process space, while other zones do not inject that mixture. In one embodiment, the mixture of gases which generate the atomic oxygen is injected into a main zone, while a subset of those gases is injected into inner and outer zones of the showerhead. The process and apparatus provides for a uniform density of atomic oxygen across the substrate being processed.

In one embodiment, a system for processing a substrate is provided. The system may comprise a showerhead, the showerhead having at least a main zone, an inner zone and an outer zone. The showerhead may further comprise a plurality of injectors configured to inject a plurality of gases into a process space of the system, the plurality of injectors including at least one main zone injector, at least one inner zone injector and at least one outer zone injector. The system may further comprise a gas phase mixer, the gas phase mixer configured to receive two or more gases, the gas phase mixer located so as to mix the two or more gases prior to provision of the two or more gases to the at least one main zone injector. Further the system is configured to process the two or more gases and produce one or more gas phase radicals to generate a uniform density of the one or more gas phase radicals across an entire radial region of the substrate.

In another embodiment, a system for processing a semiconductor substrate is provided. The system may comprise a showerhead, the showerhead having at least a main zone and an outer zone. The showerhead may further comprise a plurality of injectors configured to inject a plurality of gases into a process space of the system, the plurality of injectors including at least one main zone injector, and at least one outer zone injector. The system may further comprise a gas phase mixer, the gas phase mixer configured to receive two or more gases, the gas phase mixer located so as to mix the two or more gases prior to provision of the two or more gases to the at least one main zone injector. Further, the system is configured to provide a subset of the two or more gases to the outer zone injector, wherein the system is configured to utilize the two or more gases to produce one or more gas phase radicals in the process space.

In yet another embodiment, a method of depositing a layer on a substrate is provided. The method comprises providing a plurality of process gases and providing a showerhead having at least a main zone and an outer zone. The method further comprises providing a first plurality of gases through the showerhead main zone to a process space and premixing the first plurality of gases prior to the first plurality of gases being provided to the process space. The method further comprises obtaining a gas phase radical in the process space from the first plurality of gases, providing a subset of the first plurality of gases to the outer zone, and obtaining a uniform density of the gas phase radical across the substrate. The method further comprises utilizing the gas phase radical to deposit the layer on the substrate.

In still yet another embodiment, a method of performing a low pressure radical oxidation step of an atomic layer deposition process is provided. The method comprises providing a plurality of process gases, providing a showerhead having at least a main zone and an outer zone, and providing a first plurality of gases through the showerhead main zone to a process space. The method further comprises premixing the first plurality of gases prior to the first plurality of gases being provided to the process space and obtaining atomic oxygen (O) in the process space from the first plurality of gases. The method further comprises providing a subset of the first plurality of gases to the outer zone and obtaining a uniform density of the atomic oxygen (O) across the substrate. The method further comprises utilizing the atomic oxygen (O) to deposit a layer comprising an oxide on the substrate during the low pressure radical oxidation step.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

A process and apparatus is provided in which improved control of gas phase radicals is provided. In one embodiment, improved control of atomic oxygen is provided. In one embodiment, a system utilizing atomic oxygen is provided in which gases which generate the atomic oxygen are mixed prior to injection in a process space. The mixing may occur within a showerhead or may occur prior to entrance into the showerhead. In another embodiment, a showerhead is provided which includes multiple zones. Some of the zones of the showerhead may inject the mixture of gases which generate the atomic oxygen into the process space, while other zones do not inject that mixture. In one embodiment, the mixture of gases which generate the atomic oxygen is injected into a main zone, while a subset of those gases is injected into inner and outer zones of the showerhead. The process and apparatus provides for a uniform density of atomic oxygen across the substrate being processed.

In one embodiment, a process and apparatus having an improved control of gas phase radicals may be a system and method for spatial atomic layer deposition. In a more specific embodiment, the process and apparatus provides improved control of atomic oxygen densities for spatial atomic layer deposition.

Figure 1:
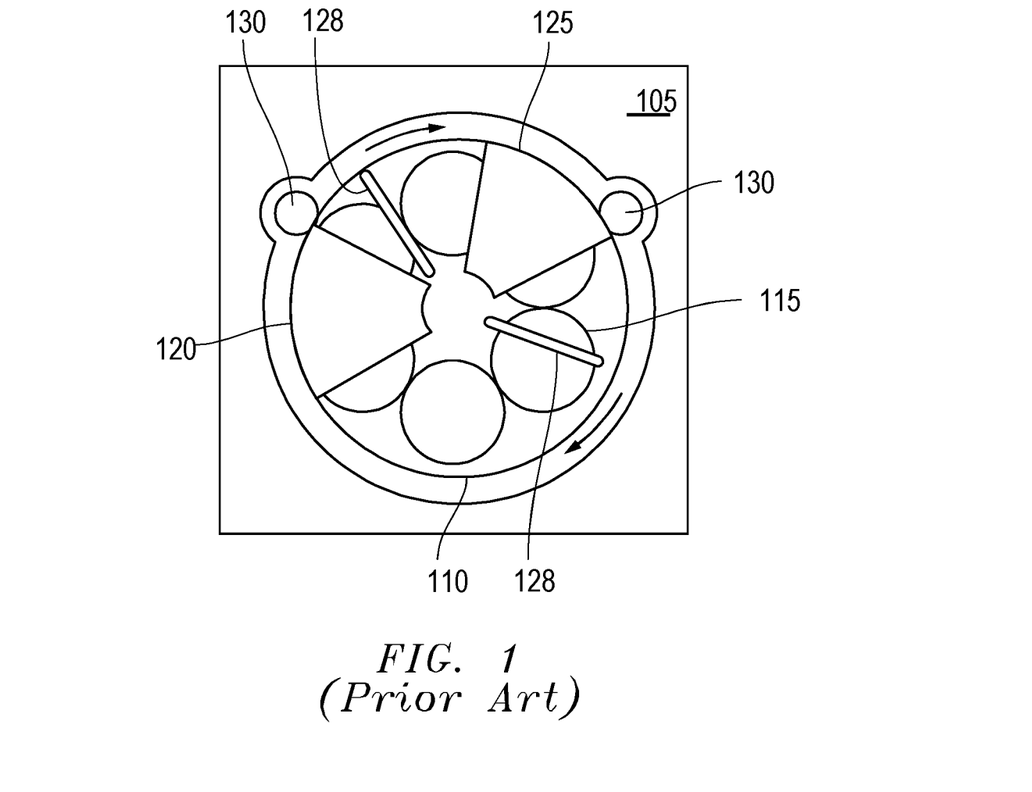
FIG. 1 illustrates a conventional spatial atomic layer deposition system.

In one embodiment, a process and apparatus described herein may be incorporated into a spatial atomic layer deposition tool utilizing a rotating platen as shown in FIG. 1. The general structure of a conventional spatial atomic layer deposition tool of FIG. 1 may be similar to those known in the art. It will be recognized, that the concepts described herein, may however, be incorporated into a wide range of other substrate processing tools. As shown in FIG. 1, a substrate process tool 100 is shown with a top view as seen inside process chamber 105 of the substrate process tool 100. A platen 110 is provided which holds one or more of substrate 115. The substrate 115 may be held on a susceptor which may heat the substrate. LPRO showerhead 120 is located above the platen 110. A silicon precursor showerhead 125 is also located above the platen 110. The platen 110 rotates (as indicated by the arrows) so that the one or more of substrate 115 may be sequentially moved under the silicon precursor showerhead 125 and then under LPRO showerhead 120. In this manner a spatial atomic layer deposition process may occur. Gas outlet pumping ports 130 are also provided as shown. A controller may be provided to control the various operating parameters of the system, including for example but not limited to, temperatures, gas flows, pressures, rotation speeds, number of atomic layer deposition cycles, etc. The substrate process tool 100 may also include nitrogen (N2) purge sources 128. N2 purge sources 128 provide a N2 purge after the substrates rotate past the LPRO showerhead 120 and the silicon precursor showerhead 125. The N2 purge sources 128 may be configured in any number of manners, such as a line of gas injectors, a line of gas injectors in a separate partitioned zone, a showerhead, etc.

Figure 2:
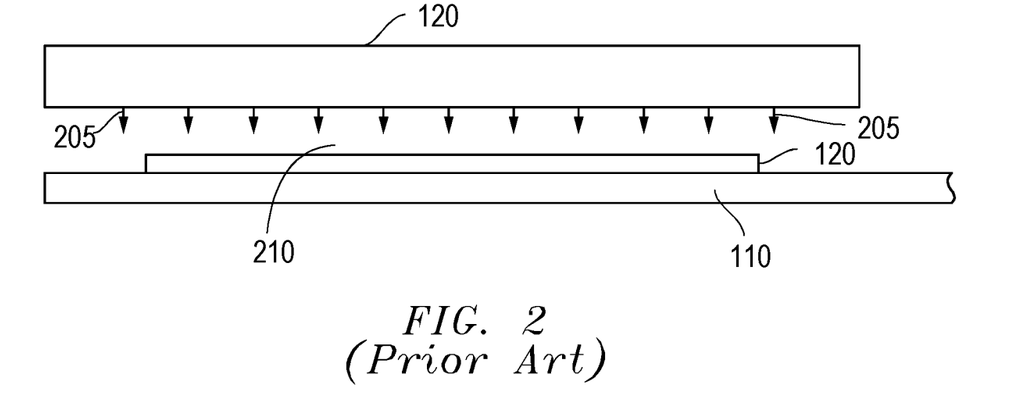
FIGS. 2-4 illustrate showerheads for use with the system of FIG. 1.
Figure 3:
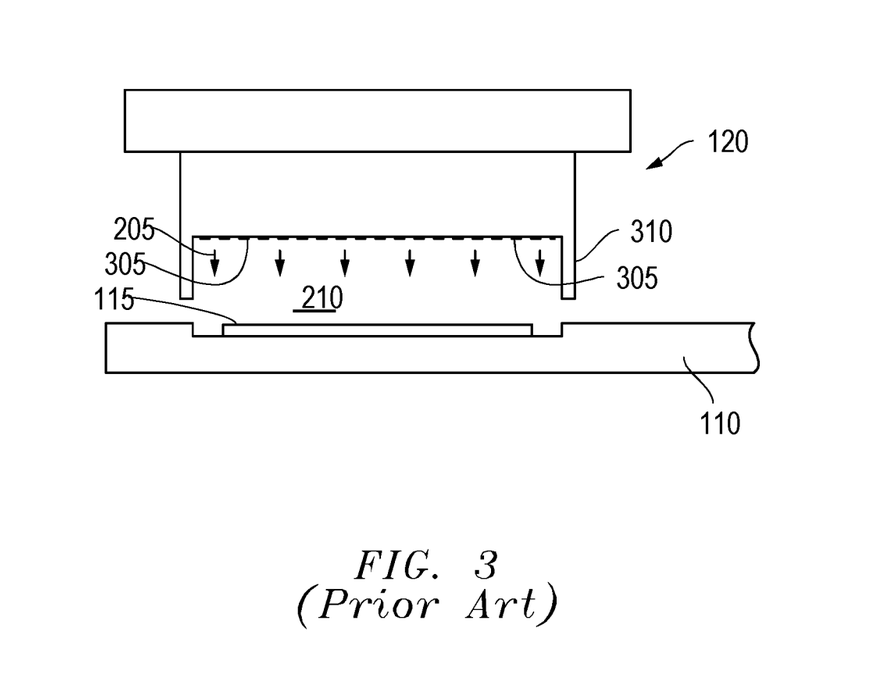
Figure 4:
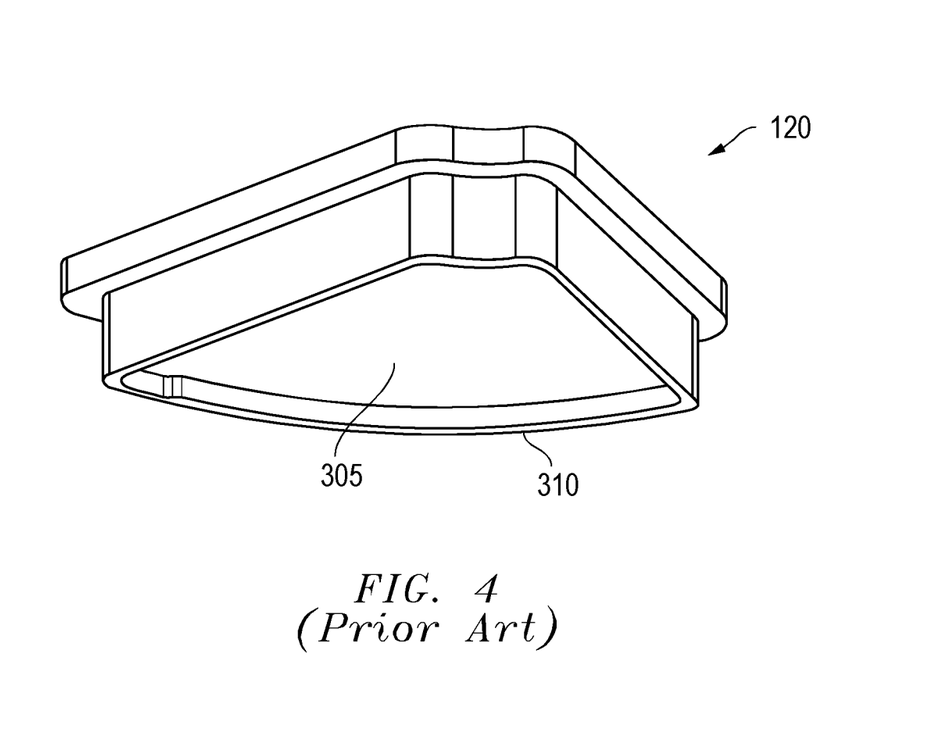

FIG. 2 illustrates a cross section of the platen 110, a substrate 115 and LPRO showerhead 120 when the substrate 115 is rotated under the LPRO showerhead 120. The LPRO showerhead injects gases (as indicated by arrows 205) into a process space 210 above the substrate 115. Gases injected from the LPRO showerhead 120 into the process space 210 are utilized as part of the atomic deposition process. A more detailed view of the LPRO showerhead 120, substrate 115 and platen 110 may be seen in FIG. 3. As shown in FIG. 3, the LPRO showerhead 120 may include injector holes 305 for injecting gases into the process space 210 as shown by arrows 205. A skirt 310 may surround the injector holes 305 as shown. A perspective view of the LPRO showerhead 120, skirt 310 and the injector holes 305 is shown in FIG. 4. The showerheads of FIGS. 2-4 are conventional. As described herein, an improved showerhead and technique for using such an improved showerhead are described.

As described herein, an improved showerhead and technique for using such an improved showerhead are described. According to the techniques disclosed herein, an LPRO showerhead is provided with different gas injection zones and the reactive gases are mixed prior to injecting those gases into the process space above the substrate. It will be recognized, however, that the premixing concept and the gas zone concept need not be utilized in combination but rather may be utilized singularly, while still obtain benefits as compared to prior art techniques.

In one embodiment, O2 and H2 are premixed prior to injection into the process space. A carrier gas such as nitrogen (N2) may also be included. The mixing may be accomplished in variety of ways. In one embodiment, mixing may occur in a gas distribution manifold or in a special mixing plenum. In another embodiment, mixing may occur within the LPRO showerhead. Other mixing techniques may also be utilized so as to provide a mixing process in which gases are mixed prior to injection into the process space (such as process space 210). Such premixing provides a more homogeneous mixture and for a more uniform process for forming atomic oxygen as compared to separate injection of gases in the process space (with mixing occurring in the process space).

It has also been found that non-uniformities in the atomic oxygen density in the process space may also result from a variety of factors. For example, it has been found that intrusion of N2 may occur at the inner and outer radial portions of the showerhead, diluting the reaction chemistry and resulting in uneven atomic oxygen densities. Further, gas temperatures have been found to be lower in the inner and outer radial portions of the showerhead, further lowering the formation of atomic oxygen. As described herein, these effects are countered by biasing the H2/O2 ratio of the process through the injection of small amounts of additional H2 in these inner and outer radial zones. This raises the H2/O2 ratio enough to compensate for temperature and N2 dilution effects. Thus, a gas injector and/or showerhead arrangement may be provided that has multiple zones so that specific gas control for different areas of the process space may be provided. In one embodiment, a main zone, an inner zone and an outer zone are provided, each with individualized control of gases is provided. In one embodiment, all gases are provided in the main zone but only a subset of gases is provided in the inner zone and the outer zone.

Figure 5:
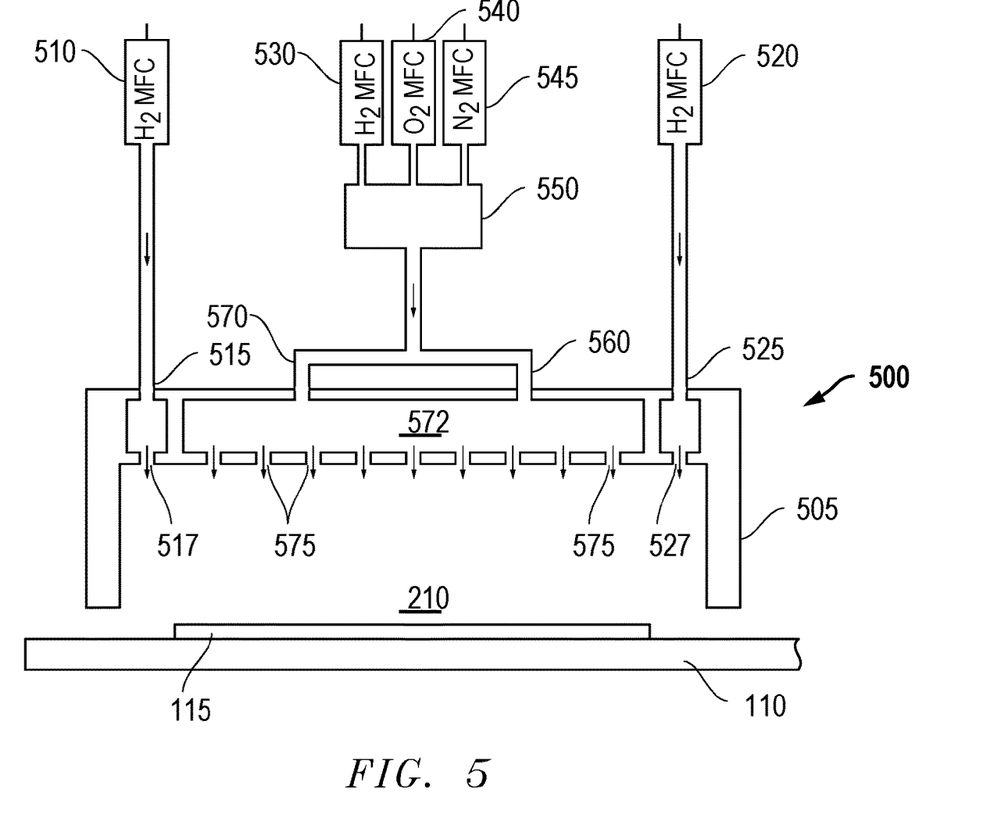
FIG. 5 illustrates an exemplary embodiment of a showerhead for a low pressure radical oxidation and an accompanying gas distribution system with premixing done prior to the showerhead.

One exemplary system for achieving the techniques described above is shown in FIG. 5. As shown in FIG. 5, a substrate processing tool includes a LPRO showerhead 500. The LPRO showerhead 500 includes a skirt 505 as shown. The LPRO showerhead 500 includes an outer zone gas inlet 515 which is connected to an outer zone H2 mass flow controller 510 and an outer zone gas injector 517 as shown. The LPRO showerhead 500 includes an inner zone gas inlet 525 which is connected to an inner zone H2 mass flow controller 520 and an inner zone gas injector 527 as shown.

The LPRO showerhead 500 also includes a first main zone gas inlet 560 and a second main zone gas inlet 570 connected to a gas mixer 550. The gas mixer 550 is connected to H2 mass flow controller 530, O2 mass flow controller 540 and N2 mass flow controller 545 as shown in FIG. 5. The main zone of the LPRO showerhead 500 includes a showerhead main zone chamber 572 and a plurality of main zone gas injectors 575 as shown. In operation, gases flow from the mass flow controllers to the injectors and into the process space 210 as shown by the arrows of the figure. Substrate 115 is provided on a platen 110 similar to that shown in the other figures.

Figure 6:
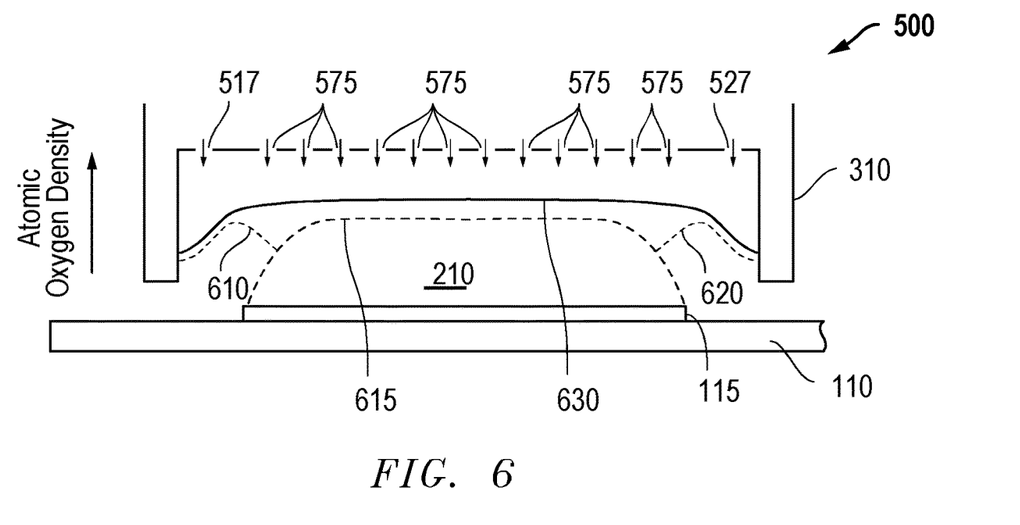
FIG. 6 illustrates an exemplary atomic oxygen density across a substrate as a result of multiple zones.

In the embodiment of FIG. 5, the reactive gases of the process (H2 and O2), are premixed before entering the process space 210. In the embodiment of FIG. 5, the premixing occurs in the gas mixer 550. The gas mixer 550 may be part of the manifold system of the substrate processing tool or may be a special mixing plenum. It will be recognized that alternative embodiments for premixing gases may also be utilized. Further, as shown in FIG. 5, the gases injected into the process space may be variably controlled across the process space to as to provide an improved uniformity of the formation of atomic oxygen. In the example shown, a main zone is provided along with inner and outer side zones. The implication of different zones may be seen in FIG. 6. As shown in FIG. 6, the process space 210, outer zone gas injector 517, main zone gas injectors 575 and inner zone gas injector 527 are provided. FIG. 6 also illustrates a graph of atomic oxygen density within the process space 210. More specifically, the net atomic oxygen density 630 is plotted as function of density versus the location across the process space 210. As indicated the net atomic oxygen density is relatively uniform across the area above the substrate 115. The net atomic oxygen density 630 is a function of the atomic oxygen formation resulting from the gases injected in each zone of the showerhead. As shown, the main zone atomic oxygen density 615 decreases near the edges of the substrate. The use of the inner zone and outer zone offsets this decrease by providing a localized increase in the atomic oxygen formation in the side zones through the injection of additional H2 so as to adjust the H2/O2 ratio in those regions. Thus as shown, an inner zone atomic oxygen density 610 and an outer zone atomic oxygen density 620 combine with the main zone atomic oxygen density 615 to provide the net atomic oxygen density 630.

Figure 7:
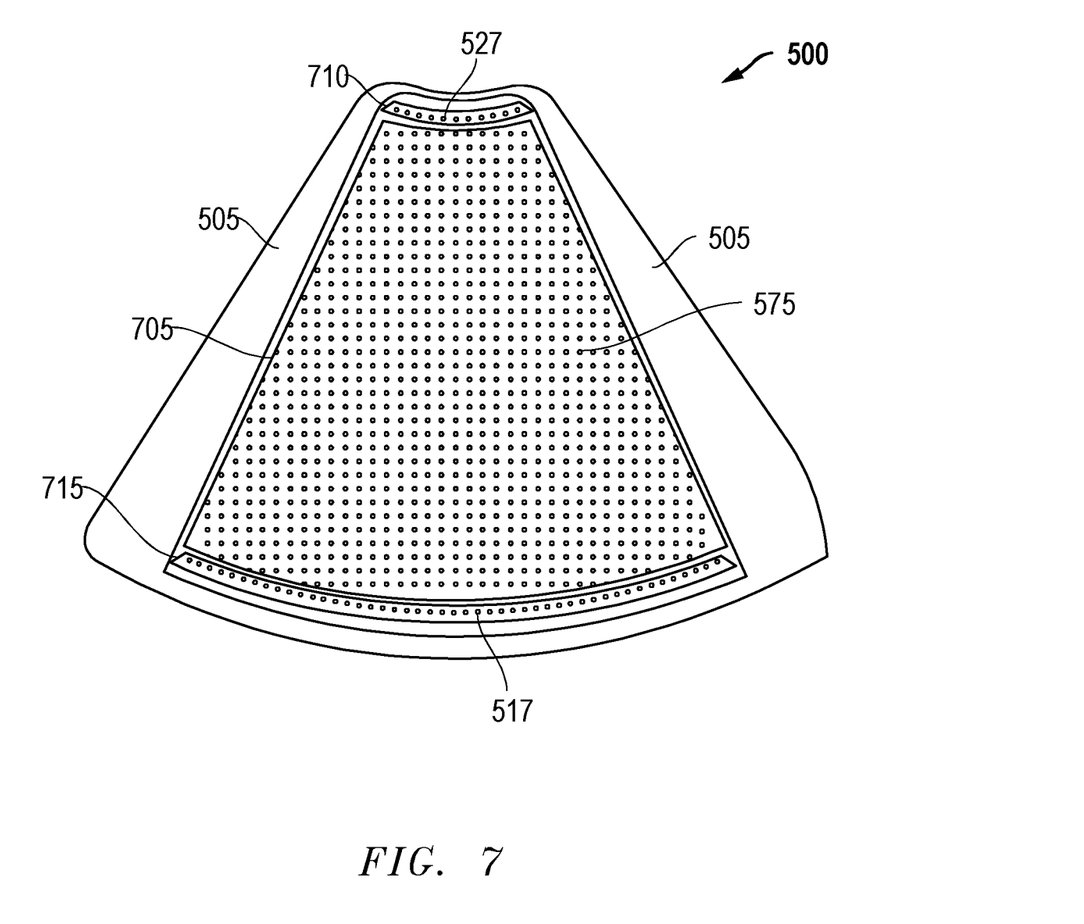
FIG. 7 illustrates a bottom view of an exemplary showerhead with multiple zones.

FIGS. 5 and 6 provide a cross-sectional view of the LPRO showerhead 500. FIG. 7 provides a bottom view of the LPRO showerhead 500. As shown in FIG. 7, the LPRO showerhead 500 includes the skirt 505 surrounding a main zone 705, an inner zone 710 and an outer zone 715. It will be recognized that the particular configuration of zones and the number of zones may be varied as the embodiment of FIG. 7 is merely exemplary. Thus, FIG. 7 merely illustrates one way of adjusting the reaction gases across an LPRO showerhead so at to provide a more uniform reaction result in a process space adjacent a substrate. Further, FIG. 7 illustrates the inner zone gas injectors 527, the main zone gas injectors 575, and the outer zone gas injectors 517 within the inner zone 710, main zone 705 and outer zone 715 respectively. It will be recognized that the particular pattern and number of injectors within each zone may be varied and the arrangement shown in the figure is merely exemplary.

Figure 8:
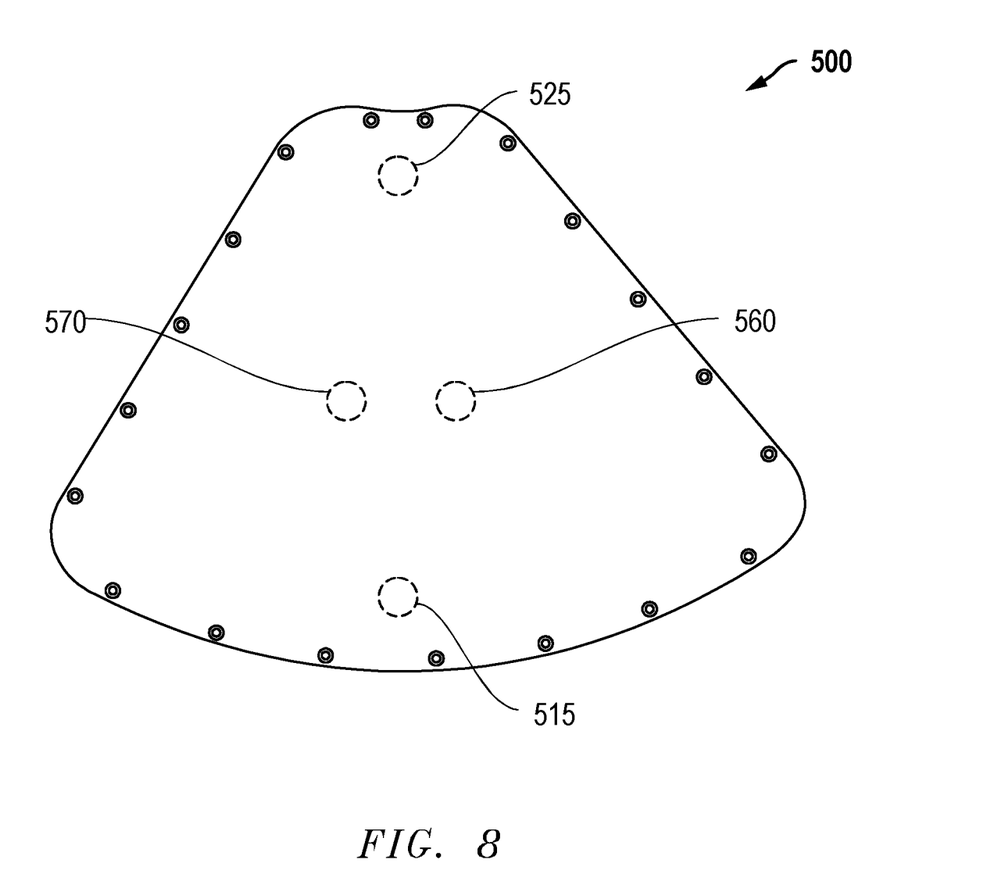
FIG. 8 illustrates a top view of the showerhead of FIG. 7.

FIG. 8 illustrates a top view of the LPRO showerhead 500 of FIGS. 5-7. As shown in FIG. 8, the LPRO showerhead 500 includes an inner zone gas inlet 525, a first main zone gas inlet 560, a second main zone gas inlet 570 and an outer zone gas inlet 515.

Figure 9:
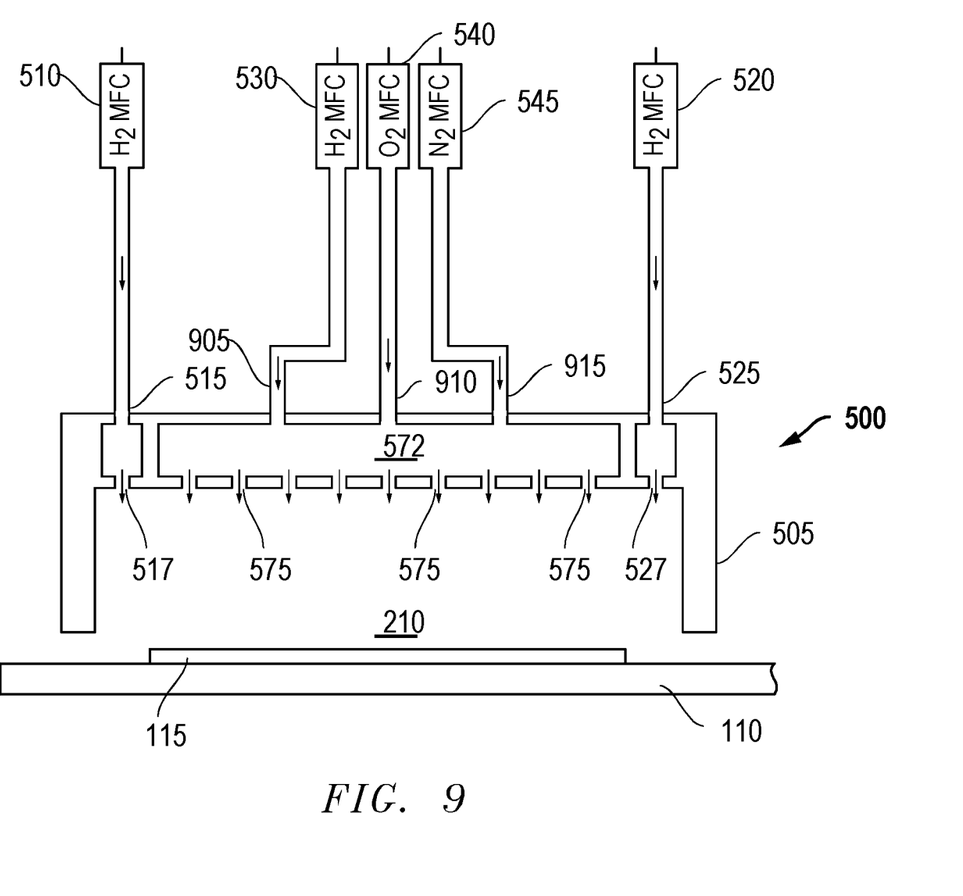
FIG. 9 illustrates an exemplary embodiment of a showerhead for a low pressure radical oxidation and an accompanying gas distribution system with premixing done in the showerhead.

As mentioned above, it is advantages to premix the reaction gases prior to injection in the process space so as to provide a more uniform process result on the substrate. As shown in FIGS. 5-8, premixing may be performed prior to injection in the showerhead. FIG. 9 illustrates an embodiment in which mixing may be performed in the showerhead itself. The embodiment of FIG. 9 is similar to that of FIG. 5, except the gas mixer 550 is not utilized. Instead, the gases H2, O2, and N2 are provided from the associated mass flow controllers to H2 gas inlet 905, O2 gas inlet 910 and N2 gas inlet 915 respectively as shown. In this embodiment, the gases may then mix in the showerhead main zone chamber 572 prior to proceeding through the main zone gas injectors 575 into the process space 210. Thus, mixing may be integrated into the functionality of the showerhead itself. Though main zone chamber 572 is shown is an open chamber, it will be recognized that it may be comprised of a labyrinth, baffles, spaces, or other channels that promote mixing of the process gases.

Figure 10:
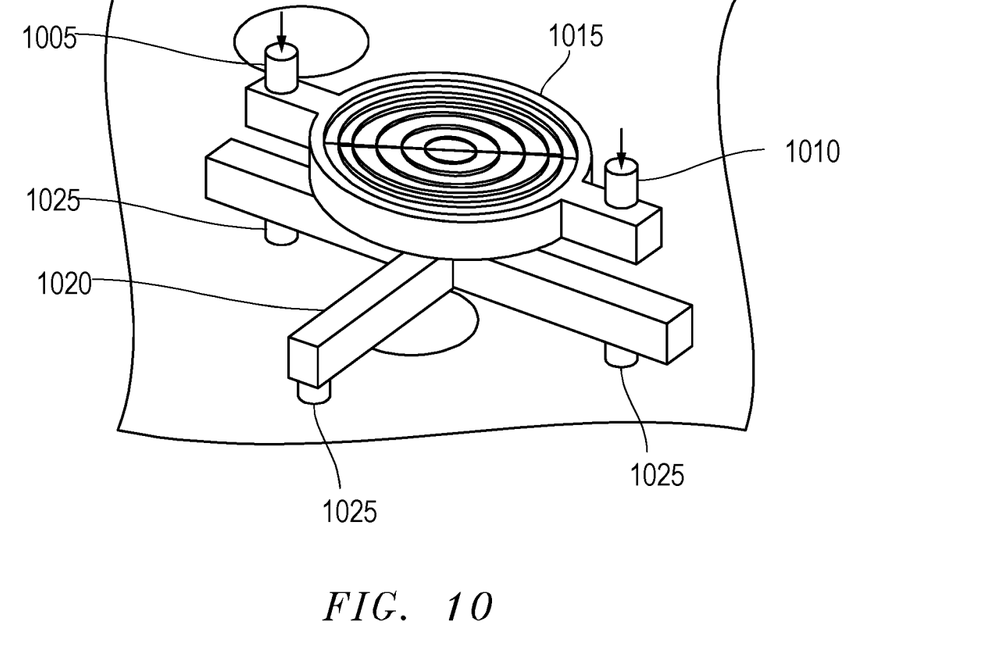
FIGS. 10 and 11 illustrate an exemplary embodiment for premixing gases in a showerhead.
Figure 11:
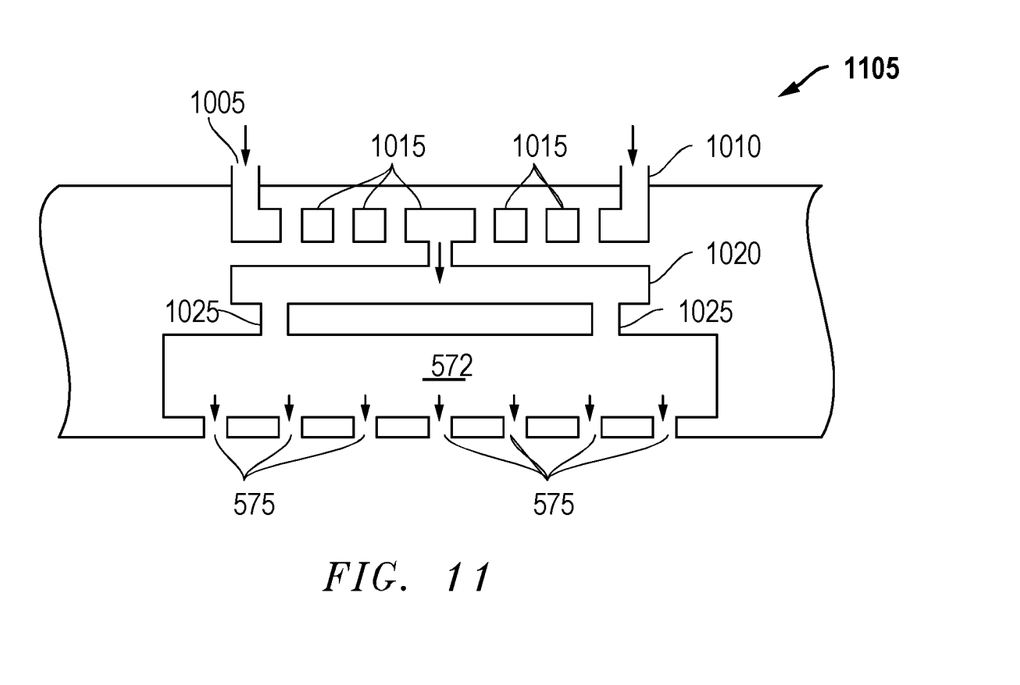

One exemplary embodiment for premixing gases in the showerhead itself is shown in FIGS. 10 and 11. As shown in FIG. 10 a limited region of a showerhead is shown, more particularly, the main zone region of the showerhead. As shown in FIG. 10, first main zone gas inlet 1005 and second main zone gas inlet 1010 are provided (similar to first main zone gas inlet 560 and second main zone gas inlet 570 of FIG. 5). For example, the first main zone gas inlet 1005 may be connected to an oxygen (O2) source and the second main zone gas inlet 1010 may be connected to an hydrogen (H2) source. Connected to the first main zone gas inlet 1005 and the second main zone gas inlet 1010 is a labyrinth 1015 within which the gases from the inlets may mix. The labyrinth 1015 may be connected to a manifold 1020 which has ports 1025. A cross-section of the structure of FIG. 10 within a showerhead 1105 is shown in FIG. 11. As shown, the first main zone gas inlet 1005 the second main zone gas inlet 1010, the labyrinth 1015, the manifold 1020 and ports 1025 provide a path for gases to mix and enter the showerhead main zone chamber 572 and then exit into the process space through main zone gas injectors 575. The showerhead and components may be formed of, in one exemplary embodiment, aluminum.

The apparatus and methods described above are useful in a wide range of applications which require the use of showerheads for injection of gases into a process space. In one embodiment, the apparatus and techniques are useful for atomic layer deposition apparatus and processes. In a more particular embodiment, the apparatus and techniques are useful for a spatial atomic layer deposition process, and more particularly an LPRO step of an atomic layer deposition process. In one particular, LPRO step, the apparatus and techniques are useful for the formation of atomic oxygen from H2 and O2 gases. A wide range of process conditions may be utilized to promote such a reaction. In one embodiment, the process conditions may include a process temperature of approximately 760 degrees Celsius, main zone O2 gas flows of 6500 standard cubic centimeters per minute (sccm), main zone H2 gas flows of 3500 sccm, main zone N2 gas flows of 8000 sccm, inner zone H2 gas flows of 50-150 sccm, and outer zone gas flows of 450-500 sccm. Further pressure in the process space may be approximately as high as 20 Torr to as low as 100 mTorr, depending on the total gas flow and temperatures. Lower total gas flows will increase the residence time of the reactive gases permitting more thorough heating and time for chemical reactions to occur. It will be recognized that such process conditions are merely exemplary and a wide range of process conditions may be utilized depending upon the particular application and needs for the process. In one embodiment, the gas ratios in the main zone are biased slightly off peak production ratios. For example, if a peak production ratio for atomic oxygen occurs at a mixture of 40% H2 and 60% O2, the main zone ratio may be run at slightly lower H2 concentrations (for example 35%) and the injection of H2 at the edge zones will compensate for losses such as N2 dilution which may occur at edge zones. Depending upon the particular hardware, process and process condition variations, the process may be inverted. For example, an H2 rich process could be run in the main zone (for example 50% H2 and 50% O2). Then, O2 may be injected in the edge zones to bias the process in a manner favoring peak production in these zones, thus providing compensation for decreased atomic oxygen at edge zones. In the exemplary embodiments, the only gas provided in the inner or outer zones may be H2 or may be O2. However, other gases may also be included in other embodiments.

The concepts described herein have been provided in the context of a spatial atomic layer deposition tool which processes multiple substrates rotating in the process tool process chamber. However, it will be recognized that the concepts described herein may be applied to single substrate chamber designs (for example single silicon wafer designs). In such cases, the zones may be configured to include one circular main zone (for circular substrates) surrounded by one outer zone running 360 degrees along the outermost periphery of the circular main zone. Other configurations are also possible, again depending upon the particular application and hardware utilized.

In one embodiment, substantial uniformity of atomic oxygen above the substrate in the process space may be obtained as the atomic oxygen density variation is less than 5% in the process space above the substrate, and in one embodiment, may even be between 1.0 to 2.5%. In this manner, radial control of gas phase radicals may be provided across a substrate to provide substantially uniform gas phase radicals, in one embodiment, atomic oxygen.

It will be recognized that the apparatus and techniques described herein may be utilized in a wider range of process chemistries. For example, in the atomic layer deposition of silicon oxynitride, O2 and ammonia (NH3) reaction gases may be utilized in the main zone. Further, the outer and inner zones may have NH3 injected into them. In general, the minority gas (or the rate limiting gas) would be injected into the periphery regions along the central axis or along the outer edge of the showerhead. This is because in the case of silicon oxynitride, the NH3 concentration (or the NH3/O2 ratio, where NH3<O2) is important in determining the amount of nitrogen incorporated into the final film. In this case, dilution of the NH3 would be the limiting factor in achieving desired film uniformity. Thus it is more efficient to vary (i.e. increase) the NH3 flow to the edge zones to restore the desired NH3/O2 ratio. As mentioned, the reaction chemistry embodiments provided herein are merely exemplary.

The premixing and zoning techniques described above may be utilized in combination or singularly. Such techniques provide for a wide dynamic range for producing atomic oxygen from low to high concentrations while maintaining desired uniformity results across a substrate. The gas flows outside of the main zone may be adjusted to compensate for various edge non-uniformities that may otherwise occur. In the exemplary embodiments discussed, a subset of the reaction gases is provided in the zones outside the main zones. In one particular embodiment, H2 is provided outside the main zone while O2 and H2 are provided in the main zone. It will be recognized that the use of zones may also include the same reaction gases across all zones, with however, the gas flows and/or ratios adjusted to compensate for variations across the substrate. Thus, described are systems and methods which may provide a uniform density of a gas phase radical (in one example atomic oxygen) across a substrate (in one example radially across a semiconductor wafer, and more particularly a silicon wafer). The system and methods provide adjustability to compensate for process variability in flow rates, temperatures, substrate rotation speed, etc. The techniques may be utilized to control low atomic oxygen concentrations provided at the beginning of atomic layer deposition processes, which is beneficial as low atomic oxygen concentration at the beginning of atomic layer deposition process will reduce substrate consumption. A controller configured to control operating variables of the system may be utilized to control the system utilizing the premixing and/or multiple zone concepts disclosed herein in order to obtain processing objectives, including a desired gas phase radical density.

Figure 12:
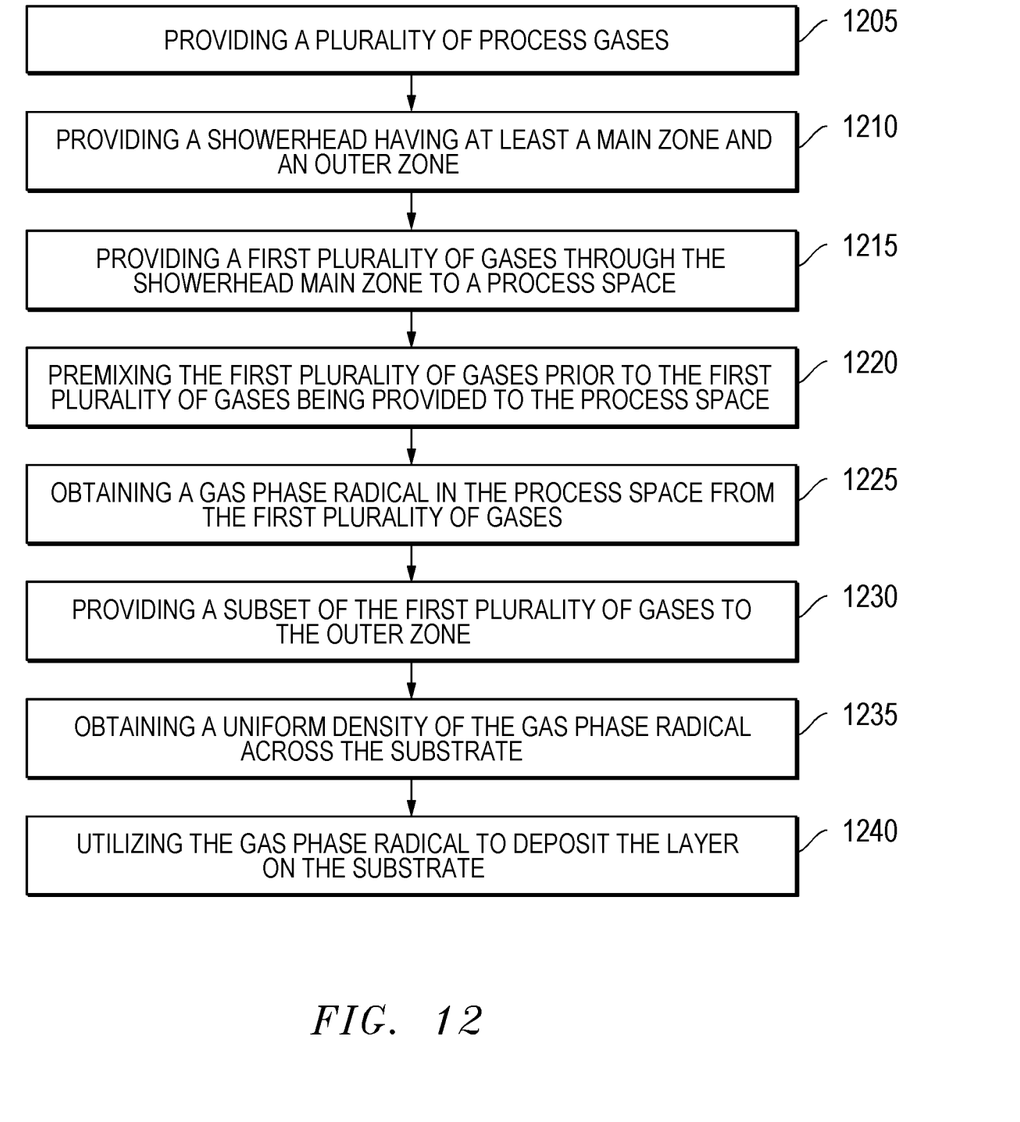
FIGS. 12 and 13 illustrate exemplary methods utilizing techniques as disclosed herein.
Figure 13:
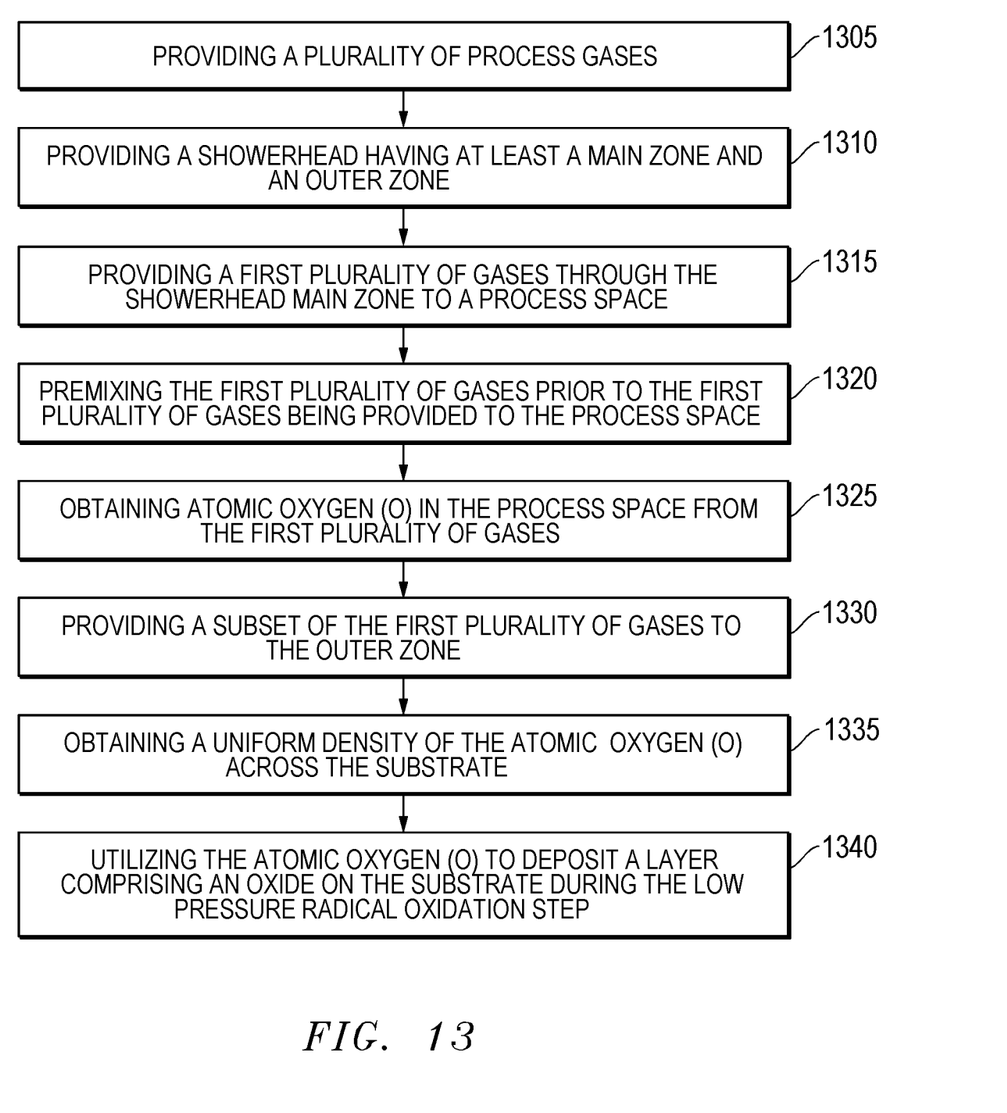

It will be recognized that the process flows described above are merely exemplary, and many other processes and applications may advantageously utilize the techniques disclosed herein. FIGS. 12-13 illustrate exemplary methods for use of the processing techniques described herein. It will be recognized that the embodiments of FIGS. 12-13 are merely exemplary and additional methods may utilize the techniques described herein. Further, additional processing steps may be added to the methods shown in the FIGS. 12-13 as the steps described are not intended to be exclusive. Moreover, the order of the steps is not limited to the order shown in the figures as different orders may occur and/or various steps may be performed in combination or at the same time.

In FIG. 12, a method of depositing a layer on a substrate is shown. The method includes step 1205 of providing a plurality of process gases and step 1210 of providing a showerhead having at least a main zone and an outer zone. The method further includes step 1215 of providing a first plurality of gases through the showerhead main zone to a process space and step 1220 of premixing the first plurality of gases prior to the first plurality of gases being provided to the process space. The method further includes step 1225 of obtaining a gas phase radical in the process space from the first plurality of gases and step 1230 of providing a subset of the first plurality of gases to the outer zone. The method also includes step 1235 of obtaining a uniform density of the gas phase radical across the substrate and step 1240 of utilizing the gas phase radical to deposit the layer on the substrate.

In FIG. 13, a method of performing on a substrate a low pressure radical oxidation step of an atomic layer deposition process is shown. The method includes step 1305 of providing a plurality of process gases and step 1310 of providing a showerhead having at least a main zone and an outer zone. The method further includes step 1315 of providing a first plurality of gases through the showerhead main zone to a process space and step 1320 of premixing the first plurality of gases prior to the first plurality of gases being provided to the process space. The method further includes step 1325 of obtaining atomic oxygen (O) in the process space from the first plurality of gases and step 1330 of providing a subset of the first plurality of gases to the outer zone. The method further includes step 1335 of obtaining a uniform density of the atomic oxygen (O) across the substrate and step 1340 of utilizing the atomic oxygen (O) to deposit a layer comprising an oxide on the substrate during the low pressure radical oxidation step.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of depositing a layer on a substrate, the method comprising:
   providing a plurality of process gases;
   providing a showerhead having at least a main zone and an outer zone;
   providing a first plurality of gases through the showerhead main zone to a process space;
   premixing the first plurality of gases prior to the first plurality of gases being provided to the process space the plurality of gasses including oxygen (O2) and hydrogen (H2);
   obtaining a gas phase radical of atomic oxygen (O) in the process space from the first plurality of gases;
   providing a subset of the first plurality of gases to the outer zone, the subset consisting of H2;
   generating a uniform density of the gas phase radical across an entire radial region of the substrate; and
   utilizing the gas phase radical to deposit the layer on the substrate and to compensate for atomic oxygen loss at the edges of the substrate.

2. The method of claim 1, wherein the premixing is performed prior to providing the first plurality of gases to the showerhead.

3. The method of claim 1, wherein the premixing is performed in the showerhead.

4. The method of claim 1, wherein the showerhead further comprises an inner zone, the subset of the first plurality of gases also provided to the inner zone.

5. A method of depositing a layer on a substrate, the method comprising:
   providing a plurality of process gases;
   providing a showerhead having at least a main zone and an outer zone;
   providing a first plurality of gases through the showerhead main zone to a process space;
   premixing the first plurality of gases prior to the first plurality of gases being provided to the process space the plurality of gasses including oxygen (O2) and hydrogen (H2);
   obtaining a gas phase radical of atomic oxygen (O) in the process space from the first plurality of gases;
   providing a subset of the first plurality of gases to the outer zone, wherein the subset of the first plurality of gases consists of O2;
   generating a uniform density of the gas phase radical across an entire radial region of the substrate; and
   utilizing the gas phase radical to deposit the layer on the substrate and to compensate for atomic oxygen loss at the edges of the substrate.

6. The method of claim 1, wherein the layer comprises an oxide.

\* \* \* \* \*